United States Patent

[11] 3,596,217

[72] Inventors John Chesney
Roselle Park;
Vincent P. Friberg, Leonia, both of, N.J.
[21] Appl. No. 849,628
[22] Filed Aug. 13, 1969
[45] Patented July 27, 1971
[73] Assignee General Instrument Corporation
Newark, N.J.

[54] CONTACTLESS VHF TUNER
20 Claims, 4 Drawing Figs.

[52] U.S. Cl. 334/7, 334/77
[51] Int. Cl. H03j 5/08, H03j 5/32, H03j 3/20
[50] Field of Search 334/14, 15, 17, 39, 52, 65, 68—70, 71, 73, 74, 77, 7

[56] References Cited
UNITED STATES PATENTS

| | | | |
|---|---|---|---|
| 2,320,483 | 6/1943 | Stocker | 334/70 |
| 2,555,511 | 6/1951 | Sands | 334/77 X |
| 2,561,494 | 7/1951 | Carlson | 334/77 X |
| 3,167,730 | 1/1965 | Anderson et al. | 334/15 |
| 3,195,080 | 7/1965 | Kenwright et al. | 334/7 |
| 3,264,566 | 8/1966 | Kaufman et al. | 334/14 X |

*Primary Examiner*—Eli Lieberman
*Assistant Examiner*—Marvin Nussbaum
*Attorney*—James and Franklin

ABSTRACT: A tuner comprises a plurality of core-tuned inductors connected in series resonant circuit relationship with a capacitor. A tuning element such as a brass cup is operatively associated with each inductor and is movable between a first position, where it is remote from its associated inductor, to a second position where it is interposed between the inductor core and winding. In that first position the tuning element preferably is of no substantial influence on its associated inductor and in that second position, the tuning element preferably substantially removes that inductor from operative tuning relation with the capacitor.

PATENTED JUL 27 1971

3,596,217

SHEET 1 OF 2

INVENTORS
JOHN CHESNEY
VINCENT P. FRIBERG
BY James and Franklin
ATTORNEY

PATENTED JUL 27 1971

3,596,217

INVENTORS
JOHN CHESNEY
VINCENT P. FRIBERG
BY James and Franklin
ATTORNEY

CONTACTLESS VHF TUNER

This invention relates generally to tuners, and particularly to a television tuner of the contactless type.

Channel selection, particularly of channels in the VHF range, is conventionally accomplished by the use of a tuner in which a selected one of a plurality of inductance elements each having a specified value of inductance is connected in resonant circuit relation with a capacitance element. In many tuners channel selection (coarse tuning) is accomplished by selectively switching an inductor into circuit relation with the resonant circuit capacitor, that inductor and capacitor defining a resonant circuit for the desired channel frequency. Fine tuning is accomplished by slightly varying the value of either the capacitor or the inductor.

Channel selection may also be achieved by the use of an incremental tuner in which a plurality of inductors are connected in series with a capacitor. A predetermined number of the coils are selectively connected to ground through the contacts of the channel selector switch, thereby leaving the appropriate value of inductance in resonant circuit relation with the capacitor to tune the receiver to the desired channel. As before, the initial coarse tuning operation may be followed by a fine tuning operation if necessary.

The most significant problem created by the use of the known tuner constructions results from the use of switch elements having a plurality of contacts. It has been found that the repeated use of these switches to effect channel selection causes a gradual erosion of wearing away of these contacts. This erosion process often progresses to an extent sufficient to cause the connection made to be intermittent with consequent loss of tuning function. When this occurs, the tuner must either be repaired or replaced, which is troublesome, expensive and time-consuming.

A secondary problem associated with the known television tuners is the difficulty in aligning the tuning elements during factory adjustment or at other times. This is particularly troublesome in aligning the high frequency band (e.g. channels 7—13 in a VHF tuner) in an incremental tuner since at that band the adjustment at one channel has a significant affect on the tuning of the adjacent high band channels. According to conventional procedure the tuner is first set to receive channel 13 and the appropriate adjustment is made to a variable tuning coil. The tuner is then set to receive channel 7 and an appropriate adjustment is made to a trimmer capacitor which is connected to the tuning coil. Since the adjustment of that capacitor at channel 7 affects the tuning at channel 13, the tuner must be reset to channel 13 and the coil once again adjusted, after which the tuner is once again set at channel 7, and the trimmer capacitor is once again adjusted. This adjustment process must usually be repeated several times until optimum alignment is achieved for tuning at channels 7 and 13, which then ensures proper tuning at all the high band channels 7—13. Alignment of the low band channels 2—6 is achieved by tuning the coil associated with each individual low band channel.

The required alignment procedure required at the high band channels in the known incremental tuners is a tedious and time-consuming process that increases the time and thus the cost of receiver alignment both during initial receiver alignment at the factory and at any subsequent alignment procedure such as in a service shop.

Another difficulty that has been encountered in the known incremental tuners is that the tuning element must often be positioned with great precision to bring about the required accuracy of tuning. Even a slight deviation in the position of the tuning element away from its nominal tuning position usually causes a significant error in the resonant frequency of the tuning circuit and thus requires the provision and adjustment of additional fine tuning circuitry to bring about desired tuning accuracy.

It is an object of the present invention to provide a tuner in which frequency selection is achieved by a contactless tuning device.

It is a further object of the present invention to provide a contactless tuner in which precise positioning of the tuning element is not required for accurate tuning.

It is another object of the present invention to provide a contactless incremental tuner in which the alignment procedure is simplified as compared to that required for the known tuners of this type.

It is yet a further object of the present invention to provide a VHF tuner for a TV receiver which provides reliable and accurate tuning over a long period of usage.

The tuner of the present invention is an incremental or step tuner which uses no switch contacts in its operation. That tuner comprises a plurality of inductors in series connection with a capacitor. A plurality of tuning elements, here shown in the form of brass caps, are individually associated with selected ones of these inductors and are selectively movable between first and second operative positions with respect to their associated inductors. In the first of these operative positions, the tuning element preferably is remote from its associated inductor and has no appreciable effect upon that inductor. In the second operative position the tuning element is positioned adjacent the inductor and has the effect of significantly modifying or effectively short-circuiting its associated inductor. Preferably, the tuning element, in moving to its operative positions, moves past the point where it has its maximum effect on the inductance of the inductor. Hence the precise location of the tuning element in either of its operative positions is not critical; considerable leeway in those positions is permitted without affecting tuning accuracy. In this manner by selectively positioning certain of the tuning elements in their second operative positions, the operative tuning circuit comprising the capacitor and the unmodified inductors (i.e. those inductors whose tuning elements are in their first operative positions) cause that circuit to resonate at, and thus tune the receiver to, the desired frequency.

As herein described the tuner is utilized in a VHF tuner in which the available channels are divided into a low band (channels 2—6) and a high band (channels 7—13). One inductor is associated with each channel. When switching from the low band to the high band, means operatively associated with the channel 7 selector are provided to operatively connect the low band inductors to a reference point such as ground, thereby to more completely remove these low band inductors from the tuning circuit.

The inductors each comprise a tuning core or slug about which a coil is wound. When the tuning element is in its second operative position, it is interposed between the core and the coil and it functions as a shorted turn, effectively cancelling out the flux within its cross-sectional area, thereby reducing the inductance of the coil in question substantially and raising the resonant frequency of the tank circuit. When the tuning element is removed from its position between the core and the coil, that is, when it is in its first operative position, it has no appreciable effect upon the value of inductance of its associated inductor.

To the accomplishment of the above, and to such other objects as may hereinafter appear, the present invention relates to a contactless tuner as defined in the appended claims, and as described in the specification, taken together with the accompanying drawings, in which:

Figure 1:
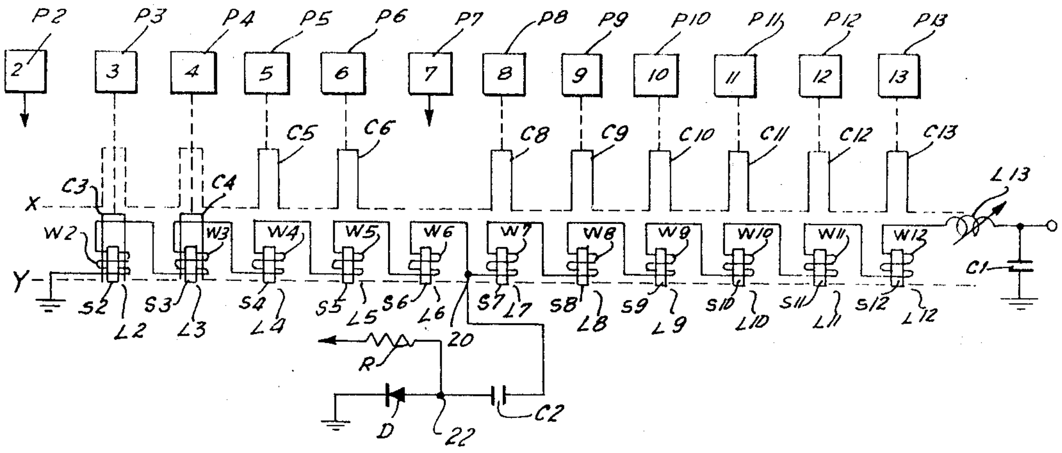
FIG. 1 is a schematic diagram illustrating the principles of operation of the contactless tuner of the present invention.

FIG. 1 illustrates the contactless tuner of the present invention in the form of a pushbutton operated VHF tuner capable of being selectively tuned to any one of the VHF channels 2-13, channels 2—6 inclusive comprising the VHF low band, and channels 7—13 inclusive comprising the VHF high band. The tuner comprises a first tuned circuit means in the form of a capacitor C1 electrically connected to a plurality of a second tuned circuit means in the form of inductors L2—L13. By selectively electrically connecting predetermined combinations or groups of inductors L2—L13 in resonant circuit relation with capacitor C1, the tuner is tuned to a selected one of the VHF channels.

To this end a plurality of tuning elements in the form of brass tuning cups C3—C6 and C8—C13 are provided; cups C3—C6 being associated in a manner more completely described below with inductors L2—L5 respectively, and tuning cups C8—L13, being similarly associated with inductors L7—L12, respectively. The tuning cups are movable between two operative positions with respect to their associated inductors. In the first of these positions the tuning cups are positioned in substantial axial registration with, and remote from, their associated inductors as indicated at datum *x* in FIG. 1, and in their second operative position indicated at datum *y* they are located in proximity to their associated inductors. (In FIG. 1 only tuning cups C3 and C4 are shown in their second operative positions, the other tuning cups C5, C6 and C8—C13 all being shown in their first operative position.)

Each of inductors L2—L12 comprises a core or slug S2—S12, of brass or, preferably, ferromagnetic in nature, around which are respectively wound coils or windings W2—W12. Coils W2—W12 are connected together in series between ground and inductor L13. When a tuning cup is in its second operative or tuning position it is received over the upper end of the core and is interposed between the core and coil of its associated inductor. When it is so positioned with respect to the core and coil it preferably extends axially beyond the coil in both directions and thus shields the coil from the magnetic effects of the core. Substantial eddy currents generated in the brass cup effectively cancel out the flux within the cup, thereby reducing its inductance substantially so that for all practical purposes, the inductor becomes an effective short circuit at the frequency of interest. When the tuning cup is in its first operative position, that is, when it is remote from its associated inductor, it has no appreciable effect upon its associated inductor.

In either of its two operative positions with respect to its associated inductor, the tuning cup may vary from its nominal position to an appreciable extent without producing an appreciable effect upon the tuning status of its associated inductor. In its first operative position the tuning cup is so far away from its associated inductor that any moderate variation in its position will not affect the inductance. In its second operative position it will have the aforesaid inductor modifying (e.g., short-circuiting) effect on the inductor so long as it is interposed between the core and the coil. The axial length of the tuning cup and the core is significantly longer than that of the coil so that this inductor-modifying condition will prevail in a substantially constant manner when the tuning cup is in its second operative position and does not vary even if the tuning cup should slightly depart from its nominal second operative position.

Thus by selectively positioning one or more of the tuning cups C3—C6 and C8—C13 in their second operative positions, those inductors associated with those tuning cups are effectively removed (short circuited) from the tuning circuit. The frequency at which the tuning circuit resonates, to wit, the VHF channel to which the receiver is tuned, is thus determined by capacitor C1, inductor L13, and those inductors L2—L12 which remain in effective resonant circuit connection with capacitor C1, that is, those inductors whose associated tuning cups are in their first operative positions.

As herein shown, the selective positioning of the tuning cups C3—C6 and C8—13 is respectively controlled by the operation of pushbuttons P3—P6 and P8—P13 respectively, operatively mechanically linked to their associated tuning cups as indicated by the broken line connections in FIG. 1. Pushbuttons P2 and P7 are also provided in the tuner but they are not mechanically linked to any tuning cup. Pushbutton P2 when depressed does act to release any previously depressed pushbuttons, thus ensuring that all of the inductors L2—L13 remain in the tuning circuit, thus conditioning the circuit for tuning channel 2. Depression of pushbutton P7 acts to remove inductors L2—L6 from the tuning circuit, leaving inductors L7—L13 serially connected therein, thus conditioning the circuit for tuning channel 7. It also insures that cups C8—C13 are released. It also acts to release cups C3—C6, conditioning the unit for sequential actuation at some later time.

In FIG. 1, for purposes of illustration, the pushbuttons and tuning cups are positioned to select channel 4. Thus pushbuttons P3 and P4 are actuated or depressed to position tuning cups C3 and C4 in their second operative or tuning positions with respect to inductors L2 and L3 respectively. These inductors are thus effectively short-circuited and the resulting operative tuning resonant circuit consists of capacitor C1 in series connection with inductors L4—L13. The values of these tuning components define a resonant circuit at the frequency corresponding to channel 4.

To select any of the highband VHF channels 7—13, it is desired to completely remove all of the low band tuning inductors L2—L6 from the tuning circuit, because as a practical matter that is the best way to insure that the channel 7 frequency of 175 MHz. is attained. For this reason, when pushbutton P7 is depressed as will occur for high band tuning, a point 20 defined between coils L6 and L7 is positively connected to ground.

Point 20 is connected to one terminal of a capacitor C2, the other terminal of which is connected to the anode terminal of a normally reverse biased and thus non conducting diode D. The cathode terminal of diode D is connected to ground. When pushbutton P7 is depressed, a forward bias signal is applied through current limiting resistor R to a point 22 defined between capacitor C2 and the anode terminal of diode D. That signal causes diode D to conduct and thus to connect point 20 to ground.

Figure 3:
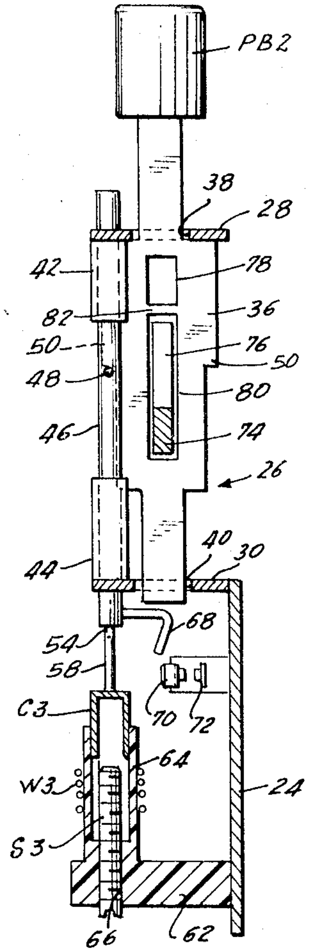
FIG. 3 is a cross-sectional view taken approximately along the line 3-3 of FIG. 2 illustrating the tuning cup in its first operative position with respect to its associated tuning inductor.
Figure 2:
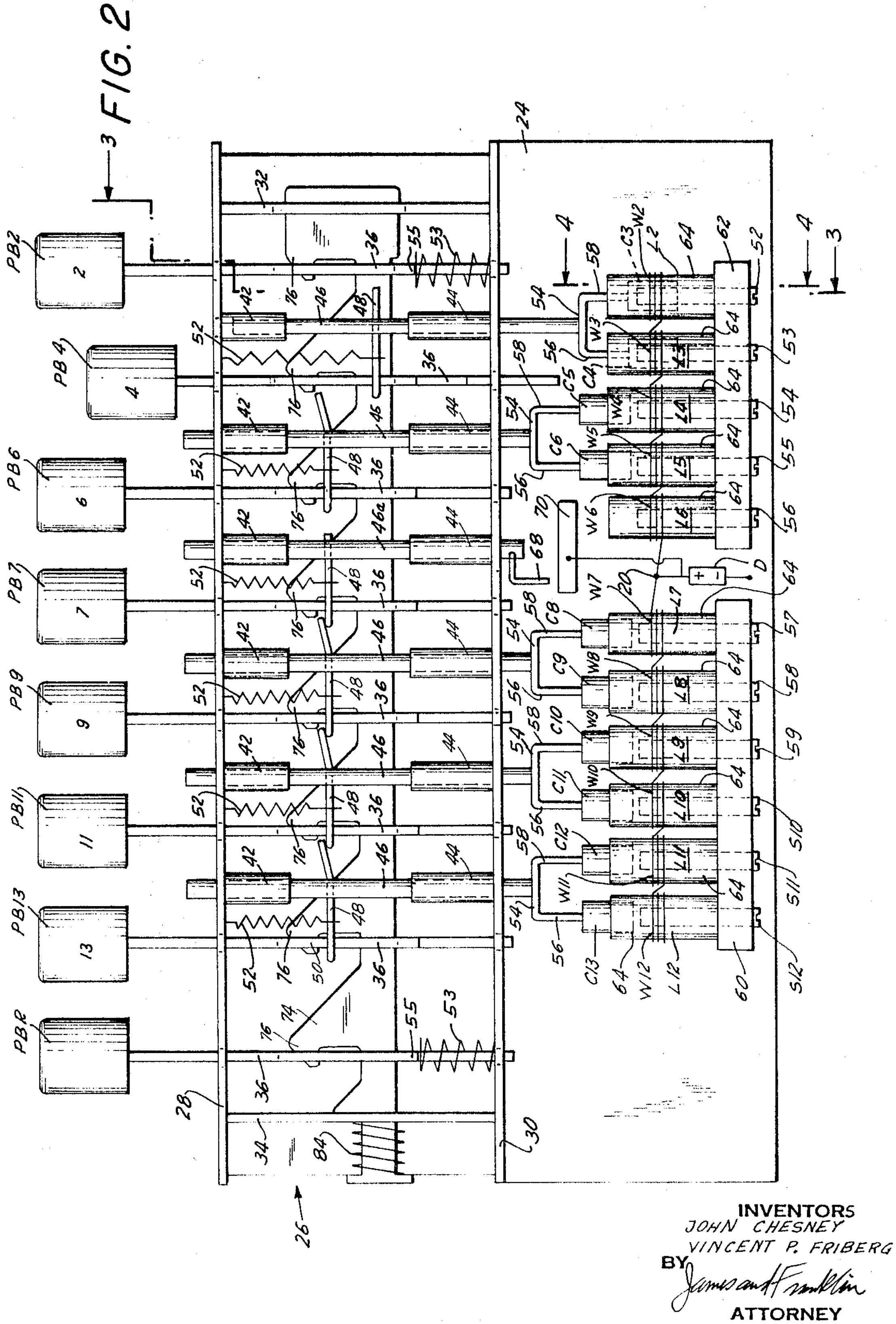
FIG. 2 is an elevational view illustrating one practical embodiment of the tuner illustrated schematically in FIG. 1.

FIGS. 2 and 3 illustrate one practical embodiment of a contactless tuner embodying features of this invention. As shown for purposes of simplified illustration, that tuner has provision for selecting only channels 2, 4, 6, 7, 9, 11 and 13, and thus is provided with only seven channel selecting pushbuttons PB2, PB4, PB6, PB7, PB9, PB11, and PB13. An additional pushbutton PBR may be provided and is effective when actuated to release any previously actuated channel selecting pushbutton.

That tuner comprises a plate 24 to which a support structure generally designated 26 is secured. Support structure 26 comprises transverse top and bottom walls 28 and 30, and vertical sidewalls 32 and 34. Each of the pushbuttons is secured to the end of an operating member or plate 36, eight of which are shown in FIG. 2. Plates 36 pass through registering slots 38 and 40 respectively formed in walls 28 and 30 (FIG. 3). A plurality of registering pairs of upper and lower sleeves 42 and 44 are respectively fixedly secured to walls 28 and 30 to the right (as viewed in FIG. 2) of their associated plates 36. A rod 46, preferably made of an insulating plastic material, is slidably received within each pair of sleeves 42 and 44. Suitable openings are provided in walls 28 and 30 to receive the upper and lower ends of rods 46 therethrough. A finger 48 extends transversely through each rod 46 and extends below and beyond a transverse extension 50 (seen best in FIG. 3) on each plate 36, extension 50 resting on finger 48. A tension spring 52 is connected at its lower end to each finger 48 and at its upper end to wall 28. There are no rods 46 associated with either pushbutton PB2 or PBR, each of these pushbuttons having a compression spring 53 positioned between the lower wall 30 and a horizontal extension 55 formed on their associated plates 36.

A yoke or bail 54 is secured to the lower end of all but one of rods 46 and has a brass tuning cup attached to the end of each of its legs 56 and 58. Insulating brackets 60 and 62 are mounted near the lower edge of plate 24 and have hollow, insulating sleeves 64 extending upwardly therefrom. Suitable internally threaded openings 66 (FIG. 3) are formed through the brackets 60 and 62 and communicate with the hollow interiors of sleeves 64. The externally threaded tuning cores L2—L12 are passed through openings 66 to threadably engage the inner walls thereof. The coils or windings W2—W12 are wound about the outer peripheries of sleeves 64 and the tuning cups C3—C6 and C8—C13 normally pass (when their associated pushbuttons are in their first operative positions) into only the upper end of the interiors of their associated sleeves 64.

Figure 4:
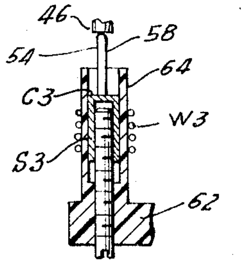
FIG. 4 is a cross sectional view taken along the line 4-4 of FIG. 2 illustrating the tuning cup in its second operative position.

Springs 52 normally urge fingers 48 and thus rods 46 and plates 36 upwards as viewed in FIGS. 2 and 4. (Similarly, springs 53 normally bias pushbuttons PB2 and PBR upward to their normal or deactuated positions shown in FIG. 2). The tuning cups for this position of the rods are raised away from the cores and windings of their associated inductors corresponding to their second operative position discussed above. To tune the receiver to one of the desired channels one of the pushbuttons PB2—PB13 is actuated by being depressed (e.g., PB4 in FIG. 2).

When PB2 is actuated there is no direct effect on the tuning circuit, since no tuning cup is associated with pushbutton PB2. Any previously actuated pushbuttons are, however, released when pushbutton PB2 is actuated. When pushbutton PB4 is actuated, as shown, its plate 36 moves downward and its finger 48 also moves downwardly, carrying with it the associated rod 46, thereby to cause the associated tuning cups (C3 and C4 in this case) to move to their second operative positions with respect to their associated inductors L2 and L3 and effectively remove these inductors from the tuning circuit. As explained above, this will cause the tuning circuit to resonate at a frequency corresponding to channel 4, as it is desired for an actuation of pushbutton PB4.

It will be noted that the finger 48 urged downward by the actuation of pushbutton PB6 normally bears down on the end of the finger 48 associated with pushbutton PB4. As a result, when pushbutton PB6 is actuated to cause tuning cups C5 and C6 to be moved to their tuning or second operative positions, it will also cause the rod 46, and thus the tuning cups C3 and C4 associated with pushbutton PB4, to be moved downward. As a result, when pushbutton PB6 is actuated all of inductors L2—L5 will be effectively shorted out as is desired for selection of channel 6. In a similar manner, for example, when pushbutton PB11 is actuated it cause the associated tuning cups of pushbutton PB9 (cups C8 and C9) as well as its own associated tuning cups (C10 and C11) to be depressed to their second operative positions with respect to their associated inductors. The actuation of pushbutton PB13 likewise causes a downward movement of the tuning cups C8, C9, C10 and C11 as well as its own associated tuning cups C12 and C13.

As described above, the actuation of pushbutton PB7 does not cause movement of a tuning cup to a tuning position, but rather connects point 20 to ground, thereby to disconnect all of the low band inductors L2—L6 from the tuning circuit. As herein shown the rod 46*a*, which is operatively associated with pushbutton PB7 and which is moved downward when pushbutton PB7 is actuated, carries a finger 68 at its lower end. A resilient switch contact 70 and a fixed contact 72 are mounted on and insulated from plate 24 (see FIG. 3). A source of DC voltage (not shown) may be connected to contact 72 and contact 70 is connected to the anode terminal of diode D. When rod 46*a* is caused to move downward upon the actuation of pushbutton PB7, finger 68 passes over resilient contact 70 causing it to move into physical and electrical connection with contact 72. As a result the DC voltage is applied to diode D, causing that diode to be conductive, thereby connecting point 20 to ground as desired. As has been noted, the finger 48 associated with pushbutton PB9 bears on the finger 48 associated with rod 46*a*. As a result, when any of pushbuttons PB9, PB11 or PB13 are actuated, rod 46*a* is urged downward to forward bias diode D and thus ground point 20. Hence for operation of any of the high band VHF channels 7, 9, 11 and 13, the low band inductors L2—L6 are automatically disconnected from the tuning circuit.

As is conventional in pushbutton tuners, means are provided in the tuner of FIGS. 2 and 3 to return an actuated pushbutton to its unactuated position upon the subsequent actuation of another pushbutton. To this end a cam plate 74 extends between walls 32 and 34. Cam plate 74 comprises a plurality of camming surfaces 76 and pushbutton plates 36 each have a pair of vertically spaced slots 78 and 80 separated by a strip 82 (FIG. 3). When a pushbutton is in its unactuated position its associated camming surface 76 extends through the lower slot 80 and when the pushbutton is moved to its actuated position the camming surface 76 passes over strip 82 and passes through the upper slot 78 of its associated plate 36, thereby retaining that pushbutton in its actuated position. The initial engagement of camming surface 76 with strip 82 when plate 36 is moved downward causes the camming surface to be urged away from lower slot 80, and the camming plate 74 temporarily releases the engagement of any previously actuated pushbutton with its associated camming surface. Springs 52 and 53, as appropriate, then move their respective plates 36 to their unactuated positions. Once the camming surface 76 associated with the newly actuated pushbutton passes over into the upper slot 78 of that pushbutton plate 36, camming plate 74 is returned to its original position by means of the return spring 84 active thereon.

Pushbuttons PB2 and PBR, when actuated, are each effective only to deactuate any other previously actuated pushbutton. Pushbutton PB2 selects channel 2 as described; pushbutton PBR may be associated with the receiver on-off switch so that when it is actuated all channel selecting pushbuttons are deactuated at the same time that the receiver is turned off.

The tuner of the present invention is thus capable of selecting one of a number of available frequencies, here shown for purposes of example as those channels in the VHF band, without the use of switch contacts. As these contacts are a frequent source of failure due to their wearing away from a prolonged period of use, the present tuner is thus far more reliable than the otherwise comparable prior art tuners. While a contact is employed for the diode D, radio frequency tank currents do not flow therethrough.

Moreover, the alignment procedure of the present tuner is significantly less complex and time-consuming than that required in the known incremental tuners. All that need be done is to first actuate all of the high band tuning cups C8—C13 and then vary the inductance of inductor L13 to tune to channel 13. The next lower channel selecting tuning cup is then deactuated, that is, tuning cup C13 is moved to its first operative position, and the inductance of inductor L12 is varied by axially moving tuning core S12 to tune for channel 12. The operation is repeated for all channels. This, it is seen, is a single operation per channel, and does not require the repeated adjustment and readjustment of inductor L13 and the tuning circuit capacitor C1 as was heretofore required.

Apart from its improved reliability, the tuner of the present invention also operates with greater accuracy without an increase in the cost or complexity of the tuner structure since the accurate positioning of the tuning cups in not a critical feature. The position of the tuning cups with respect to their nominal operative positions may vary considerably without affecting the tuning condition of their associated tuning inductors. Thus additional components to ensure precise positioning of the tuning cups in either of their operative positions are not required.

While the tuner of the present invention has been herein specifically shown as a pushbutton VHF tuner, it may be used with slight slight modification for selecting frequencies in other bands, and may be operated by means other than pushbuttons, e.g., by appropriate cam and lever arrangements, which are effective when actuated to move the tuning cups between their operative tuning positions. The inductors, too, could be widely varied in design and construction.

Thus while only a single embodiment of the present invention has been herein specifically disclosed, it will be apparent that many variations may be made thereto without departing from the spirit and scope of the present invention.

We claim:

1. A tuner for use in a communications receiver for selectively tuning to one of a given plurality of available frequencies, said tuner comprising a first tuned circuit means, said given plurality of second tuned circuit means electrically connected to said first tuned circuit means, frequency selecting means for operatively actuating a predetermined number of said second tuned circuit means, said frequency selecting means comprising individual tuning elements for at least some of said individual second tuned circuit means respectively movable from a first to a second operative position respectively operatively spaced from and in operative tuning relation with their associated second tuned circuit means, said elements normally being in one of said positions, and control means respectively operatively connected to said tuning elements and effective when actuated selectively to move a predetermined number of said tuning elements, corresponding to the desired one of said available frequencies, from said one of their operative positions into the other while having the others of said tuning elements in said one operative position, thereby to operatively tune said tuner to said desired on of said available frequencies.

2. The tuner of claim 1, in which said first tuned circuit means comprises capacitance means, and said second tuned circuit means comprises inductance means.

3. The tuner of claim 2, in which said tuning elements comprise a member which when in its said first position has no appreciable effect on the tuned status of its associated second tuned circuit means, and when in its said second position has such an appreciable effect.

4. The tuner of claim 3, in which said tuning element member is so related to said second tuned circuit means that the departure thereof from either its said first or said second position over an appreciable range has no effect on the tuned status of said second tuned circuit means.

5. The tuner of claim 2, in which said tuning element member is so related to said second tuned circuit means that the departure thereof from either its said first or said second position over an appreciable range has no effect on the tuned status of said second tuned circuit means.

6. The tuner of claim 2, in which said inductance means comprises a core and a coil wound about said core but leaving a space therebetween, said tuning elements being respectively disposed in substantial registration with their associated inductance means when in their first operative position and received in said space and interposed between said core and said coil when in their second operative position.

7. The tuner of claim 6, in which said tuning element is axially spaced from said inductance means when in its said first position and extending axially beyond said coil in both directions when in its said second position 8. The tuner of claim 2, comprising a reference point, said inductance means comprising a first plurality of inductors and a second plurality of inductors operatively connected to said first plurality of inductors and defining a junction point therebetween, said control means comprising means effective when appropriately actuated to operatively connect said junction point to said reference point, thereby to operatively disconnect said first plurality of inductors from said capacitance means.

9. The tuner of claim 8, comprising normally nonconducting switch means operatively connected between said junction point and said reference point, said reference point connecting means comprising means effective when actuated to apply a signal to said switching means, thereby to render the latter conductive.

10. The tuner of claim 9, in which said switching means comprises a normally nonconductive diode, said signal being effective when applied to forward bias said diode and thus render it conductive.

11. The tuner of claim 9, in which said control means comprises means effective when appropriately actuated to return all of said tuning elements in their said second position to their said first position and to remove said signal from said switching means.

12. The tuner of claim 1, in which said tuning elements comprise a member which when in its said first position has no appreciable effect on the tuned status of its associated second tuned circuit means, and when in its said second position has such an appreciable effect.

13. The tuner of claim 12, in which said tuning element member is so related to said second tuned circuit means that the departure thereof from either its said first or said second position over an appreciable range has no effect on the tuned status of said second tuned circuit means.

14. The tuner of claim 1, in which said tuning element member is so related to said second tuned circuit means that the departure thereof from either its said first or said second position over an appreciable range has no effect on the tuned status of said second tuned circuit means.

15. A tuner for use in a communications receiver for selectively tuning to one of a plurality of available frequencies, said tuner comprising a first tuned circuit means, a plurality of second tuned circuit means electrically connected to said first tuned circuit means, frequency selecting means for operatively actuating a predetermined number of said second tuned circuit means, said frequency selecting means comprising a plurality of tuning elements for said individual second tuned circuit means respectively movable between first and second operative positions respectively operatively spaced from and in operative tuning relation with their associated second tuned circuit means, and control means respectively operatively spaced from and in operative tuning relation with their associated second tuned circuit means, and control means respectively operatively connected to said tuning elements and effective when actuated selectively to move one or more of said tuning elements from one of their operative positions to the other, thereby to operatively tune said tuner to a given one of said available frequencies, in which said first tuned circuit means comprises capacitance means, and said second tuned circuit means comprises inductance means, and in which said inductance means comprises a core and a coil wound about said core but leaving a space therebetween, said tuning elements being respectively disposed in substantial registration with their associated inductance means when in their first operative position and received in said space and interposed between said core and said coil when in their second operative position.

16. The tuner of claim 15, in which said tuning element is axially spaced from said inductance means when in its said first position and extending axially beyond said coil in both directions when in its said second position.

17. A tuner for use in a communications receiver for selectively tuning to one of a plurality of available frequencies, said tuner comprising a first tuned circuit means, a plurality of second tuned circuit means electrically connected to said first tuned circuit means, frequency selecting means for operatively actuating a predetermined number of said second tuned circuit means, said frequency selecting means comprising a plurality of tuning elements for said individual second tuned circuit means respectively movable between first and second operative positions respectively operatively spaced from and in operative tuning relation with their associated second tuned circuit means, and control means respectively operatively connected to said tuning elements and effective when actuated selectively to move one or more of said tuning elements from one of their operative positions to the other, thereby to operatively tune said tuner to a given one of said available frequencies, in which said first tuned circuit means comprises capacitance means, and said second tuned circuit means comprises inductance means, and further comprising a reference point, said inductance means comprising a first plurality of inductors and a second plurality of inductors operatively connected to said first plurality of inductors and defining a junction point therebetween, said control means comprising means effective when appropriately actuated to operatively connect said junction point to said reference point, thereby to operatively disconnect said first plurality of inductors from said capacitance means.

18. The tuner of claim 17, comprising normally nonconducting switch means operatively connected between said junction point and said reference point, said reference point connecting means comprising means effective when actuated to apply a signal to said switching means, thereby to render the latter conductive.

19. The tuner of claim 18, in which said switching means comprises a normally nonconductive diode, said signal being effective when applied to forward bias said diode and thus render it conductive.

20. The tuner of claim 18, in which said control means comprises means effective when appropriately actuated to return all of said tuning elements in their said second position to their said first position and to remove said signal from said switching means.